United States Patent [19]

Rapp

[11] Patent Number: 4,758,749
[45] Date of Patent: Jul. 19, 1988

[54] CMOS CURRENT SENSE AMPLIFIER
[75] Inventor: A. Karl Rapp, Los Gatos, Calif.
[73] Assignee: National Semiconductor Corporation, Santa Clara, Calif.
[21] Appl. No.: 51,542
[22] Filed: May 19, 1987
[51] Int. Cl.[4] .......................................... G01R 19/165
[52] U.S. Cl. .................................... 307/530; 307/451; 307/550; 307/585; 330/264; 365/189
[58] Field of Search ............... 307/443, 448, 451, 530, 307/350, 548, 550, 554, 576, 579, 584–585; 330/264–265, 257, 288; 365/184–185, 189, 206

[56] References Cited

U.S. PATENT DOCUMENTS

| | | | |
|---|---|---|---|
| 4,152,595 | 5/1979 | Garfinkel et al. | 307/350 |
| 4,274,014 | 6/1981 | Schade, Jr. | 307/451 X |
| 4,326,136 | 4/1982 | Le Can et al. | 307/451 |
| 4,420,726 | 12/1983 | Limberg | 330/257 X |
| 4,453,094 | 6/1984 | Peil et al. | 307/579 X |
| 4,459,497 | 7/1984 | Kuo et al. | 307/530 |
| 4,464,591 | 8/1984 | Rapp | 307/530 |
| 4,567,387 | 1/1986 | Walyk | 307/530 |
| 4,587,446 | 5/1986 | Okumura | 307/445 X |

Primary Examiner—Stanley D. Miller
Assistant Examiner—D. R. Hudspeth
Attorney, Agent, or Firm—Gail W. Woodward; Lee Patch; Mark Aaker

[57] ABSTRACT

A CMOS current sense amplifier is composed of an output inverter gate, a combined driver and biasing stage that biases the output inverter gate and drives its transistors, and an input stage that acts to reduce the input voltage swing. The circuit responds rapidly to input current changes and is therefore useful in sensing the currents in large memory arrays that have large shunt capacitance values.

5 Claims, 1 Drawing Sheet

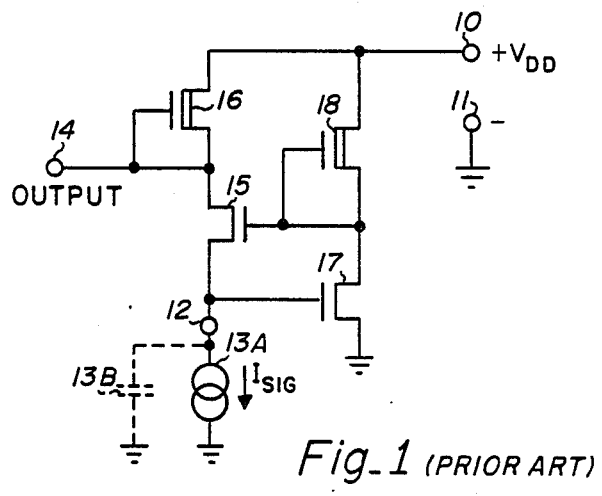
*Fig_1* (PRIOR ART)
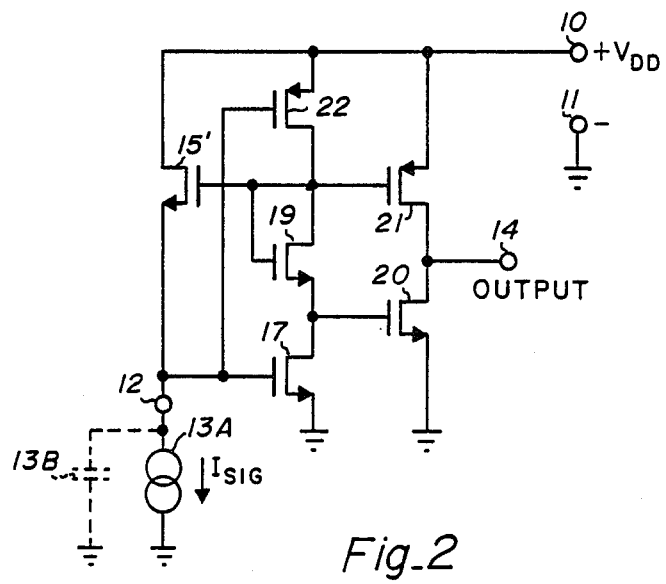
*Fig_2*

CMOS CURRENT SENSE AMPLIFIER

BACKGROUND OF THE INVENTION

Semiconductor memory devices employ an array of memory cells arranged in columns and rows to cover an area of an integrated circuit (IC) chip. The cells are addressed by means of decoder circuitry that selects the particular cell in the array that is to be either written or read out. In the read-out operation, the electrical state of the cell is read-out by means of a sense amplifier which is connected to a plurality of cells. Such a connection involves a substantial shunt or stray capacitance. When an array is made very large, the stray capacitance of the circuits is large. When a voltage responsive sense amplifier is employed, a large array entails the charging and discharging of a large capacitance. Such an action slows the speed of response. However, if the sense amplifier is made current responsive, the voltage swings can be reduced to a small value so that speed is not adversely affected by the capacitance. In particular, it is desirable to employ a current sense amplifier that reduces the signal voltage swings and yet produces a high speed high output signal.

My U.S. Pat. No. 4,464,591, issued Aug. 7, 1984, to the assignee of the present invention, discloses and claims a current difference sense amplifier. N-channel devices are disclosed in the preferred embodiment. The teaching in this patent is incorporated herein by reference.

U.S. Pat. No. 4,464,591 discloses a prior art current sense amplifier and describes its operation in detail. To summarize, the prior art circuit will respond to a 50-microampere input signal. The circuit is arranged so that this signal results in an input voltage swing of only about 20-millivolts. Such a slight voltage swing will not produce substantial charging and discharging of the memory cell capacitance. Therefore, the large shunt capacitance of a large array is not associated with a large reduction of the speed of response. However, it is shown that in the prior art circuit the size of the transistor in the signal output section must be compromised between the output signal voltage and the speed of response. Accordingly, it would be desirable to eliminate the prior art output transistor. It would also be desirable to employ complementary metal oxide semiconductor (CMOS) elements to fabricate the circuits.

SUMMARY OF THE INVENTION

It is an object of the invention to provide a current sense amplifier which has a low signal input voltage swing, avoids the output transistor size compromize, produces a large output voltage swing, and uses little supply current.

It is a further object of the invention to create a current sense amplifier using CMOS circuit elements that produce a rapid response, relatively large output signal voltage swing and produces a relatively small input signal voltage swing.

These and other objects are achieved in a CMOS circuit configured as follows. The output stage is an inverter gate in which the complementary transistor gates are coupled together with an N channel transistor having its drain connected to its gate. This biases the P channel transistor gate approximately one threshold ($V_{TN}$) above the N channel transistor gate. The N channel output transistor gate is driven from a common source N channel transistor inverter which has its gate connected to the circuit input terminal. The gate of the P channel output transistor is driven by a P channel transistor inverter which also has its gate connected to the circuit input terminal. The gate of the P channel output transistor is also connected to the gate of an N channel source follower transistor which has its source returned to the circuit input terminal. This source follower transistor completes a negative feedback path around the drain and gate of the N channel driver transistor. This negative feedback stabilizes the voltage at the circuit input terminal so as to reduce the input voltage swings to a small value. This means that as the circuit responds to the input current signals, the shunt capacitance does not have to be significantly charged or discharged. However, the circuit output voltage will represent a relatively large signal swing.

BRIEF DESCRIPTION OF THE DRAWING

FIG. 1 is a schematic diagram of a prior art current sense amplifier.

FIG. 2 is a schematic diagram of the circuit of the invention.

DESCRIPTION OF THE PRIOR ART

The schematic diagram of FIG. 1 shows a current sense amplifier using N channel transistors. The circuit operates from a power supply connected + to $V_{DD}$ terminal 10 and − to ground terminal 11. The circuit input terminal 12 responds to a signal current shown schematically as 13A. Since this input will commonly be a large area memory array it will display shunt capacitance 13B. The circuit output appears at terminal 14. Depletion load transistor 16 develops the output signal as a result of the current flowing in transistor 15. Input terminal 12 is directly coupled to the gate of transistor 17 which operates as a high gain inverter. Depletion load transistor 18 develops a signal resulting from the current flow in transistor 17. The drain of transistor 17 is directly coupled to the gate of transistor 15, the source of which is coupled back to input terminal 12.

This circuit configuration produces a high gain negative feedback loop around input terminal 12, the voltage of which is stabilized at close to the threshold, $V_{TN}$, of transistor 17. Any current flowing in input terminal 12 must also flow in transistor 15 and hence transistor 16.

When $I_{SIG}$ is at a logic one ($I_{SIG}\neq 0$) terminal 12 will be pulled down thereby tending to turn transistor 17 off. Transistor 18 will pull the gate of transistor 15 up so as to turn it on. The conduction of transistor 15 will stabilize where it conducts $I_{SIG}$ which also flows in transistor 16. The voltage drop across transistor 16 will place terminal 14 below the level of $V_{DD}$.

When $I_{SIG}$ is at a logic zero ($I_{SIG}=0$) the potential at terminal 12 will rise thereby turning transistor 17 on. This pulls the gate of transistor 15 down so as to reduce its conduction. The negative feedback will stabilize the bias on transistor 15 to where it is just at cutoff. For this condition transistor 16 will pull terminal 14 up close to $V_{DD}$.

It is clear that the resistance of transistor 16 must be sufficiently large to allow $I_{SIG}$ to develop an output signal at terminal 14. However, large resistance means that the charging of the shunt capacitance at terminal 14 will be slowed thereby limiting the circuit response speed. Thus, the selection of transistor 16 represents a design compromise. Ideally, it would be desirable to return the drain of transistor 15 directly to $V_{DD}$.

DESCRIPTION OF THE INVENTION

The schematic diagram of FIG. 2 shows the circuit of the invention which employs CMOS elements. Where the parts function in a manner similar to that of FIG. 1 the same element designations are employed.

Note that the drain of N channel transistor 15' is returned directly to $V_{DD}$. Input terminal 12 is directly coupled to a high gain N channel transistor 17 which has its drain directly coupled to the gate of N channel output transistor 20 and, via level shifting N channel transistor 19, to the gate of P channel output transistor 21. The gate of transistor 21 is also directly coupled to the gate of source follower transistor 15' which has its source coupled to terminal 12. Thus, a high gain negative feedback loop is created around terminal 12 and, since the drain of transistor 15' is returned directly to $V_{DD}$ no device compromise is required.

P channel transistor 21 acts with N channel transistor 20 to form a CMOS inverter gate that provides the circuit output at terminal 14. The drain of common source N channel transistor 17 directly drives the gate of N channel output transistor 20. The biasing of transistors 20 and 21 is such that they do not both conduct simultaneously. Either transistor 20 will conduct in response to the presence of $I_{SIG}$ or transistor 21 will conduct in response to the absence of $I_{SIG}$. This means that no direct current flows in the output stage thus improving circuit efficiency.

P channel transistor 22 forms a second CMOS inverter gate with N channel transistor 17 and has its gate driven by input terminal 12. This second CMOS inverter gate acts as the driver for the output stage. At the circuit operating point this second inverter gate is active and a relatively small bias current flows in transistors 17, 19 and 22. This bias current may be designed to approximate $I_{SIG}$ so that the total current in the driver portion of the circuit is substantially constant. For a logic one, $I_{SIG}$ will be flowing in transistor 15 and the current in transistor 17 is reduced to close to zero. Conversely, when $I_{SIG}$ goes to zero the current flowing in N channel transistor 17 approximates $I_{SIG}$.

As a practical matter, N channel transistor 15' is made small to provide relatively low source follower gain. Therefore, its gate will require a large signal swing to hold the potential at terminal 12 substantially constant. Sufficient voltage drive for output stage, transistors 20-21, thus is achieved.

For a logic zero input at terminal 12 ($I_{SIG}=0$) the potential at terminal 12 rises so that transistor 17 turns on. This will pull the gate of transistor 20 down so as to turn it off. The gate of transistor 21 will be slightly more than the threshold of N channel transistor 19 above the gate of N channel transistor 20. This voltage is sufficiently low to turn P channel transistor 21 on so as to pull output terminal 14 up close to $V_{DD}$. Since the source of N channel transistor 15' has risen and its gate has been pulled down its conduction will go to zero. Also, since the potential of terminal 12 has risen slightly the conduction of P channel transistor 22 will be reduced thereby enhancing the pull down of the gates of P channel transistor 21 and N channel transistor 15'.

For a logic one input at terminal 12 ($I_{SIG}\neq 0$) the potential at terminal 12 will be pulled down thereby reducing conduction in N channel transistor 17. This will also increase the conductivity of P channel transistor 22 thereby pulling the gate of N channel transistor 15' up. The total result is to turn N channel transistor 15' on sufficiently to conduct $I_{SIG}$ and to reduce the conduction in N channel transistor 17. This same action turns N channel transistor 20 on and P channel transistor 21 off so as to pull output terminal 14 close to ground.

EXAMPLE

The following CMOS transistor W/L dimensions will produce satisfactory circuit performance:

| TRANSISTOR | W/L DIMENSIONS (MICRONS) |
|---|---|
| 15 | 3/1.5 |
| 17 | 35/1.5 |
| 19 | 8/1.5 |
| 20 | 15/2 |
| 21 | 30/2 |
| 22 | 8/2 |

Using the above-listed transistor dimensions the circuit of FIG. 2 was investigated for use where $I_{SIG}$ was 200 microamperes. $V_{DD}$ was 5 volts. The voltage swing at terminal was about 400 millivolts. The voltage at terminal 14 was found to swing to within 0.4 volt and 0.25 volt respectively of $V_{DD}$ and ground.

The invention has been described and a working embodiment detailed. When a person skilled in the art reads the foregoing description, alternatives and equivalents, within the spirit and intent of the invention, will be apparent. Accordingly it is intended that the scope of the invention be limited only by the following claims.

I claim:

1. A CMOS current sensing amplifier having an input terminal coupled to a memory element to determine the electrical state thereof and an output terminal which produces a voltage state indicative of the state of the current in said memory element, said amplifier comprising;

an output inverter gate including a P channel transistor inverter and an N channel transistor inverter, said output inverter gate having an output terminal that acts as said amplifier output terminal and P channel and N channel transistor gate input terminals;

voltage dropping means coupled between said P channel transistor gate and said N channel transistor gate to provide bias for said output inverter gate;

a P channel transistor inverter having an output coupled to said P channel transistor gate and an input coupled to said amplifier input terminal;

an N channel transistor inverter having an output coupled to said N channel transistor gate and an input coupled to said amplifier input terminal; and an N channel transistor source follower having an input coupled to said P channel transistor gate and an output coupled to said amplifier input terminal.

2. The current sensing amplifier of claim 1 wherein said N channel transistor source follower has the smallest transistor channel width to length ratio in said amplifier.

3. The current sensing amplifier of claim 1 wherein said N channel transistor inverter has the largest transistor channel width to length ratio in said circuit.

4. The current sensing amplifier of claim 1 wherein said voltage dropping means comprise an N channel transistor having its drain connected to its gate.

5. The current sensing amplifier of claim 2 wherein said transistors are selected so that the current flowing in said N channel voltage transistor under logic zero input conditions is approximately equal to the current flowing in said N channel transistor source follower under logic one input conditions.

* * * * *